United States Patent
Hando

(10) Patent No.: US 10,986,760 B2
(45) Date of Patent: Apr. 20, 2021

(54) COMPONENT SUPPLY DEVICE, AND METHOD FOR MOVING PALLET

(71) Applicant: FUJI CORPORATION, Chiryu (JP)

(72) Inventor: Hiroyuki Hando, Komaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/605,665

(22) PCT Filed: Apr. 17, 2017

(86) PCT No.: PCT/JP2017/015478
§ 371 (c)(1),
(2) Date: Oct. 16, 2019

(87) PCT Pub. No.: WO2018/193501
PCT Pub. Date: Oct. 25, 2018

(65) Prior Publication Data
US 2020/0077549 A1  Mar. 5, 2020

(51) Int. Cl.
*H01K 13/02* (2006.01)
*H05K 13/02* (2006.01)
(Continued)

(52) U.S. Cl.
CPC ........... *H05K 13/021* (2013.01); *B65G 47/90* (2013.01); *H05K 13/0084* (2013.01);
(Continued)

(58) Field of Classification Search
CPC ............. H05K 13/021; H05K 13/085; H05K 13/0882; H05K 13/0084; H05K 13/0434; B65G 47/90; B65G 2201/0267
See application file for complete search history.

(56) References Cited

U.S. PATENT DOCUMENTS

| | | | |
|---|---|---|---|
| 7,142,939 B2 * | 11/2006 | Nonaka | G05B 19/41805 700/121 |
| 8,635,766 B2 * | 1/2014 | Hanamura | H05K 13/0434 29/740 |

(Continued)

FOREIGN PATENT DOCUMENTS

| | | |
|---|---|---|
| JP | 2002-246791 A | 8/2002 |
| JP | 2008-288533 A | 11/2008 |

OTHER PUBLICATIONS

International Search Report dated Jul. 18, 2017 in PCT/JP2017/015478 filed Apr. 17, 2017.

*Primary Examiner* — Lynn E Schwenning
(74) *Attorney, Agent, or Firm* — Oblon, McClelland, Maier & Neustadt, L.L.P.

(57) ABSTRACT

A component supply device includes multiple magazines each provided with multiple slots accommodating the respective pallets by allotting one or more of the slots depending on the height of the accommodating section, the multiple magazines including a first magazine accommodating the pallets to be dispensed to a supply area of the components, and a second magazine accommodating the pallets to be transferred to and from the first magazine; and a control device, in a case of moving the pallet from the first magazine to the second magazine among the multiple magazines, setting a moving destination from among available slots based on the accommodation information about the second magazine taking into consideration a number of slots occupied by the pallet to be moved, and controlling the loading/unloading device so as to move the pallet to the moving destination.

4 Claims, 9 Drawing Sheets

(51) Int. Cl.
*H05K 13/08* (2006.01)
*B65G 47/90* (2006.01)
*H05K 13/00* (2006.01)

(52) U.S. Cl.
CPC ....... *H05K 13/085* (2018.08); *H05K 13/0882* (2018.08); *B65G 2201/0267* (2013.01)

(56) References Cited

U.S. PATENT DOCUMENTS 9,999,170 B2 * 6/2018 Iwata ................ H05K 13/0434
2004/0031768 A1 2/2004 Kakita et al.

* cited by examiner

| MAGAZINE TYPE | SLOT | COMPONENT TYPE | NUMBER OF COMPONENTS |
|---|---|---|---|
| FIRST (40A) | S1 | A1 | 8 |
| | S2 | AVAILABLE | — |
| | S3 | ↓ | — |
| | S4 | B1 | 5 |
| | S5 | A4 | ** |
| | S6 | A3 | 9 |
| | S7 | A2 | ** |
| | S8 | A5 | ** |
| | S9 | ↓ | — |
| | S10 | B2 | ** |
| | S11 | ↓ | ** |
| | S12 | B1 | ** |
| SECOND (40B) | S1 | A3 | ** |
| | S2 | AVAILABLE | — |
| | S3 | AVAILABLE | — |
| | S4 | A5 | ** |
| | S5 | AVAILABLE | — |
| | S6 | A2 | ** |
| | S7 | ↓ | — |
| | S8 | B1 | ** |
| | S9 | A4 | 0 |
| | S10 | ↓ | — |
| | S11 | B2 | ** |
| | S12 | A1 | ** |

Fig. 8

| MAGAZINE TYPE | SLOT | COMPONENT TYPE |
|---|---|---|
| FIRST (40A) | S1 | A1 |
| | S2 | AVAILABLE |
| | S3 | ↓ |
| | S4 | B1 |
| | S5 | A4 |
| | S6 | A3 |
| | S7 | A2 |
| | S8 | A5 |
| | S9 | ↓ |
| | S10 | B2 |
| | S11 | ↓ |
| | S12 | B1 |

| MAGAZINE TYPE | SLOT | COMPONENT TYPE |
|---|---|---|
| SECOND (40B) | S1 | A3 |
| | S2 | AVAILABLE |
| | S3 | AVAILABLE |
| | S4 | A5 |
| | S5 | AVAILABLE |
| | S6 | A2 |
| | S7 | ↓ |
| | S8 | B1 |
| | S9 | A4 |
| | S10 | ↓ |
| | S11 | B2 |
| | S12 | A1 |

Fig. 10A

| MAGAZINE TYPE | SLOT | COMPONENT TYPE | NUMBER OF COMPONENTS |
|---|---|---|---|
| SECOND (40B) | S1 | A3 | ** |
| | S2 | AVAILABLE | — |
| | S3 | AVAILABLE | — |
| | S4 | A5 | ** |
| | ⋮ | ⋮ | ⋮ |

Fig. 10B

| MAGAZINE TYPE | SLOT | COMPONENT TYPE | NUMBER OF COMPONENTS |
|---|---|---|---|
| SECOND (40B) | S1 | A3 | ** |
| | S2 | AVAILABLE | — |
| | S3 | A1 | 0 |
| | S4 | A5 | ** |
| | ⋮ | ⋮ | ⋮ |

Fig. 10C

| MAGAZINE TYPE | SLOT | COMPONENT TYPE | NUMBER OF COMPONENTS |
|---|---|---|---|
| SECOND (40B) | S1 | AVAILABLE | — |
| | S2 | AVAILABLE | — |
| | S3 | A1 | 0 |
| | S4 | A5 | ** |
| | ⋮ | ⋮ | ⋮ |

US 10,986,760 B2

COMPONENT SUPPLY DEVICE, AND METHOD FOR MOVING PALLET

TECHNICAL FIELD

The present specification discloses a component supply device and a method for moving a pallet.

BACKGROUND ART

Conventionally, there has been proposed a component supply device having a magazine in which multiple slots for accommodating pallets are provided at a constant pitch, and the pallets are pulled out from the magazine to supply components on a tray placed on the pallet (for example, see Patent Literature 1). This component supply device has two magazines which are arranged vertically and can be individually moved up and down, one of which is a main magazine used for supplying components, and the other magazine is a sub-magazine used for transferring pallets to and from the main magazine. The component supply device supplies components while moving used pallet, which are, for example, depleted of accommodated components, from the main magazine to the sub-magazine, or moving new pallets loaded with accommodated components from the sub-magazine to the main magazine.

PATENT LITERATURE

Patent Literature 1: JP-A-2008-288533

BRIEF SUMMARY

Technical Problem

Tray, which functions as accommodation section, placed on the pallet has different height depending on the height of the component to be accommodated, and when a pallet having a large height including a tray height is accommodated in the magazine, the pallet may occupy multiple consecutive slots in the up-down direction. When such a pallet is transferred between the main magazine and the sub-magazine, the pallet cannot be moved unless the required number of consecutive slots for occupation are available in the vertical direction. In such a case, it becomes necessary for the operator to swap pallets or an error occurs in which the pallet cannot be moved.

The main object of the present disclosure is to smoothly transfer a pallet between magazines.

Solution to Problem

The present disclosure employs the following means in order to achieve the above-mentioned main object.

A component supply device of the present disclosure is configured to supply components by using pallets, each of which is provided with an accommodating section configured to accommodate the components to be picked up, the component supply device comprising: multiple magazines, each being provided with multiple slots capable of accommodating the respective pallets by allotting one or more of the slots depending on the height of the accommodating section, the multiple magazines including a first magazine capable of accommodating the pallets to be dispensed to a supply area of the components, and a second magazine capable of accommodating the pallets to be transferred to and from the first magazine; a loading/unloading device configured to move up and down relative to the multiple magazines and convey the pallets into and out of the slots; a storage device configured to store accommodation information of the pallets accommodated in the multiple magazines; and a control device configured to, in a case of moving the pallet from the first magazine to the second magazine among the multiple magazines, set a moving destination from among available slots based on the accommodation information about the second magazine taking into consideration a number of slots occupied by the pallet to be moved, and control the loading/unloading device so as to move the pallet to the moving destination.

The component supply device of the present disclosure, in the case of moving a pallet from one of multiple magazines to another magazine among the multiple magazines, sets a moving destination in accordance with the number of slots occupied by the pallet to be moved, from among the available slots based on the accommodation information about the other magazine, and moves the pallet to the set moving destination. As a result, since the pallet can be appropriately moved to the moving destination corresponding to the number of slots necessary to accommodate the pallet, it is possible to smoothly transfer the pallet between the magazines while minimizing the dispersion of the available slots.

BRIEF DESCRIPTION OF DRAWINGS

FIG. 5 A diagram showing an example of storage information stored in memory section 38a.

FIG. 6 A diagram showing an example of mounting order information stored in memory section 80a.

FIG. 8 A diagram showing a destination of pallet P.

FIG. 10 A diagram showing the moving destination of pallet P of the modification.

DESCRIPTION OF EMBODIMENTS

Figure 1:
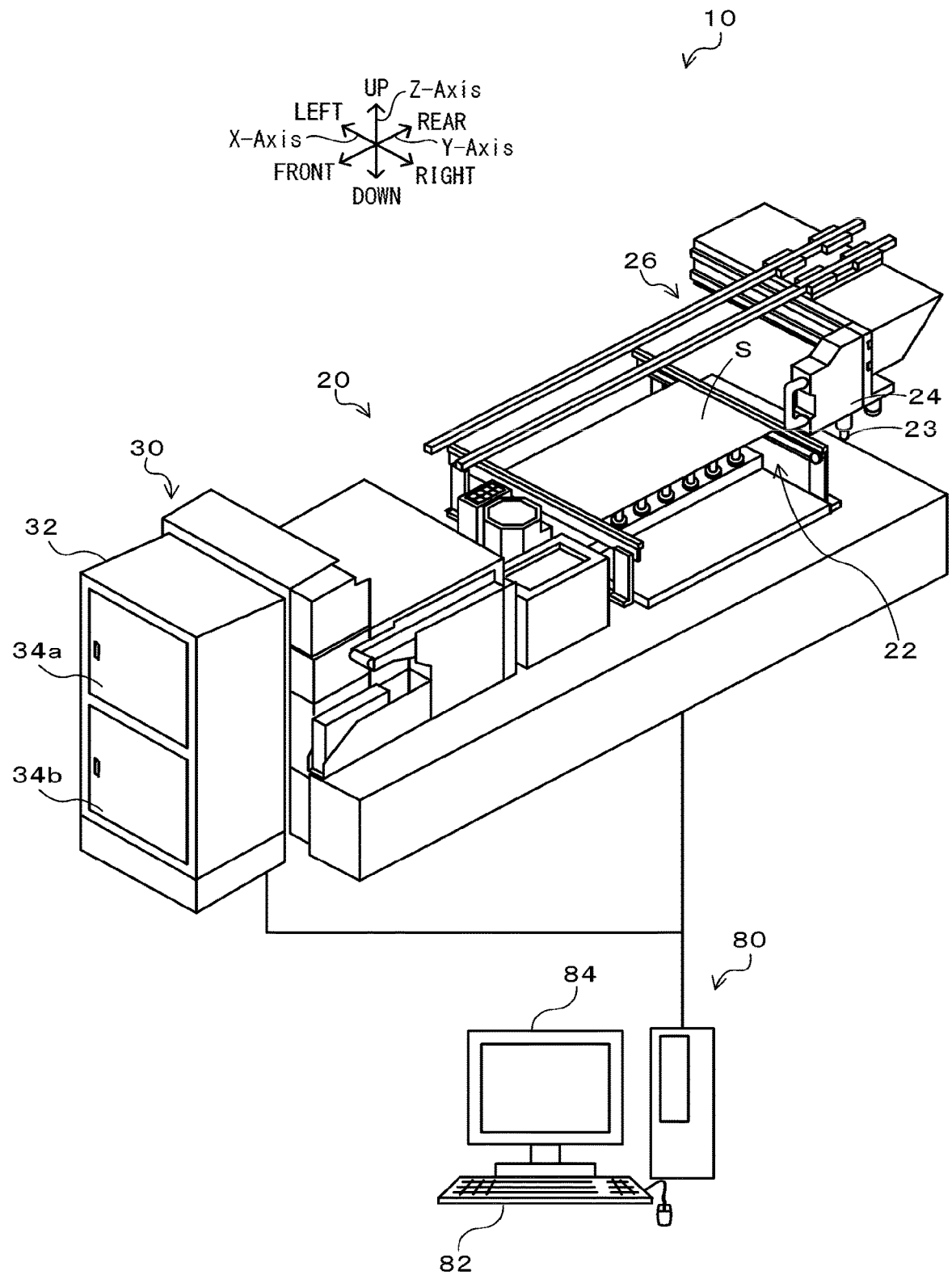
FIG. 1 A diagram (perspective view) showing a schematic configuration of component mounting system 10.
Figure 2:
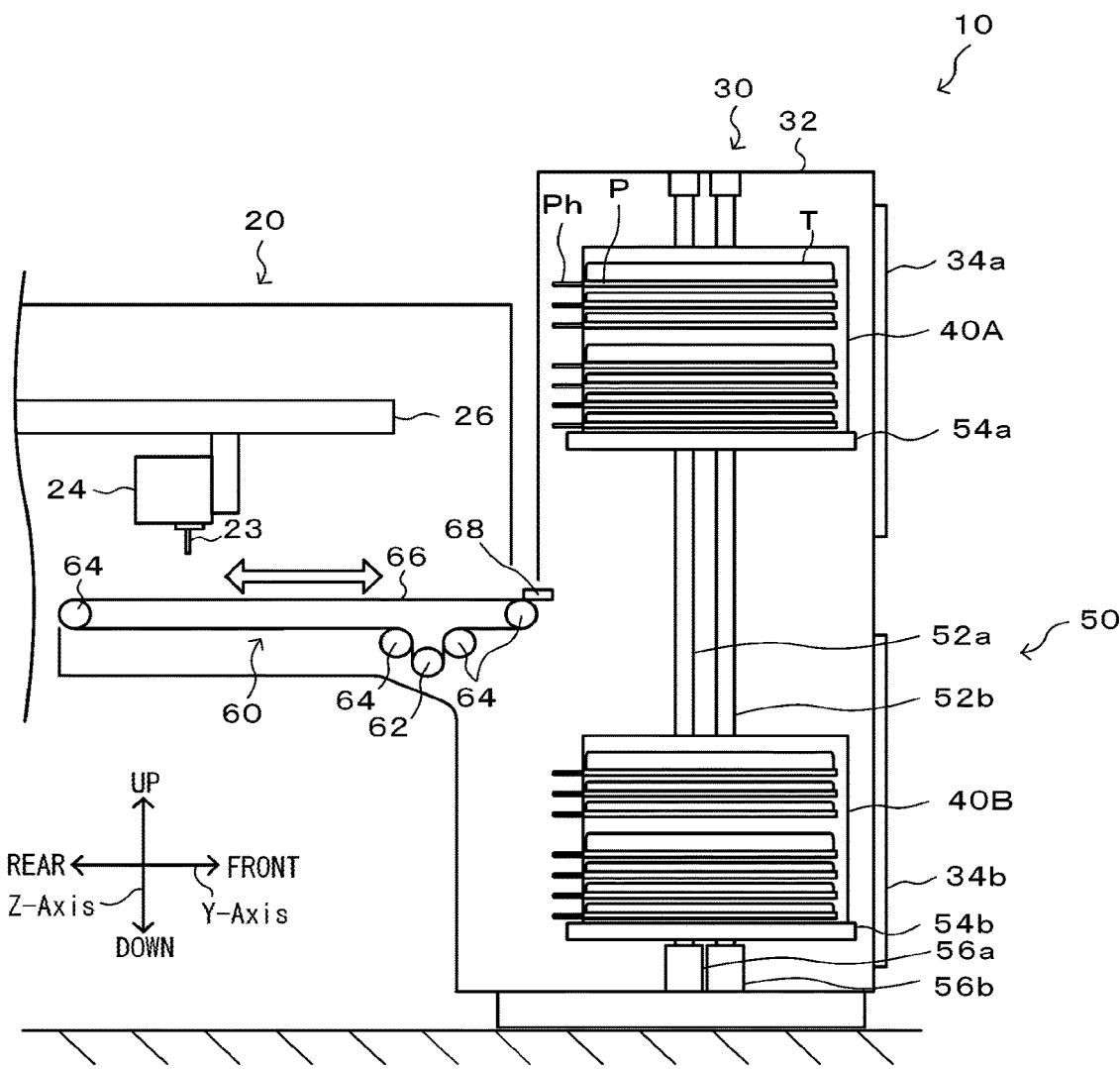
FIG. 2 A diagram (side view) showing a schematic configuration of component mounting system 10.
Figure 3:
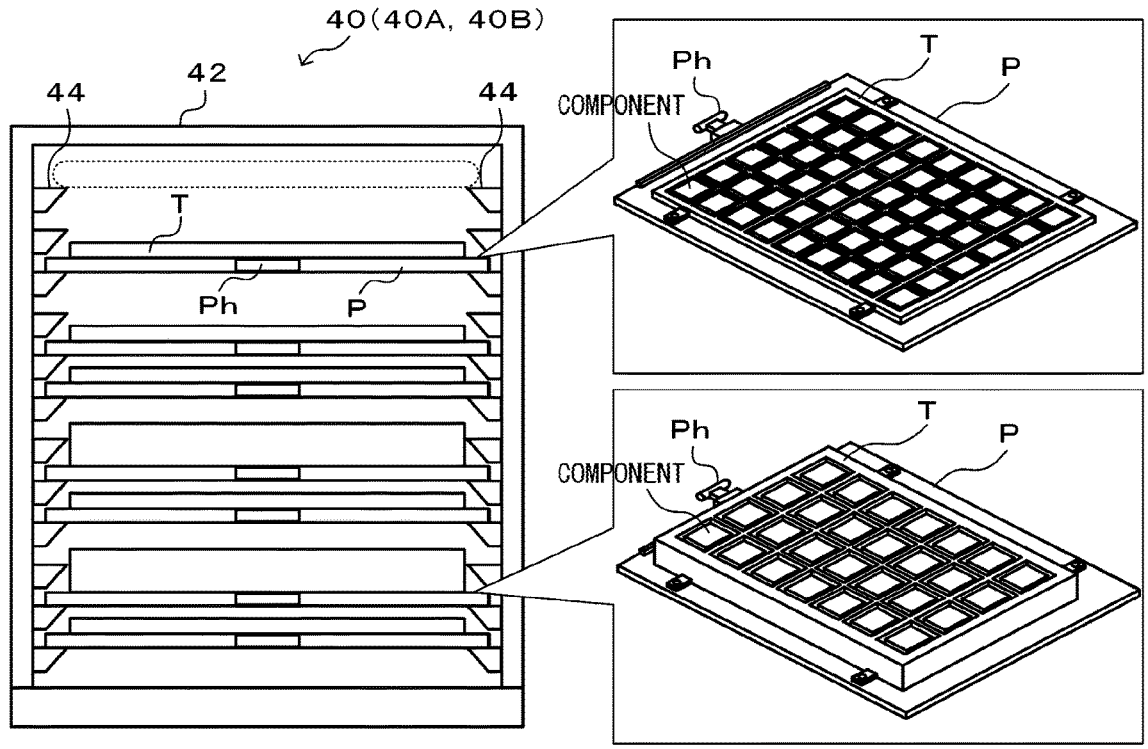
FIG. 3 A diagram (front view) showing a schematic configuration of magazine 40.
Figure 4:
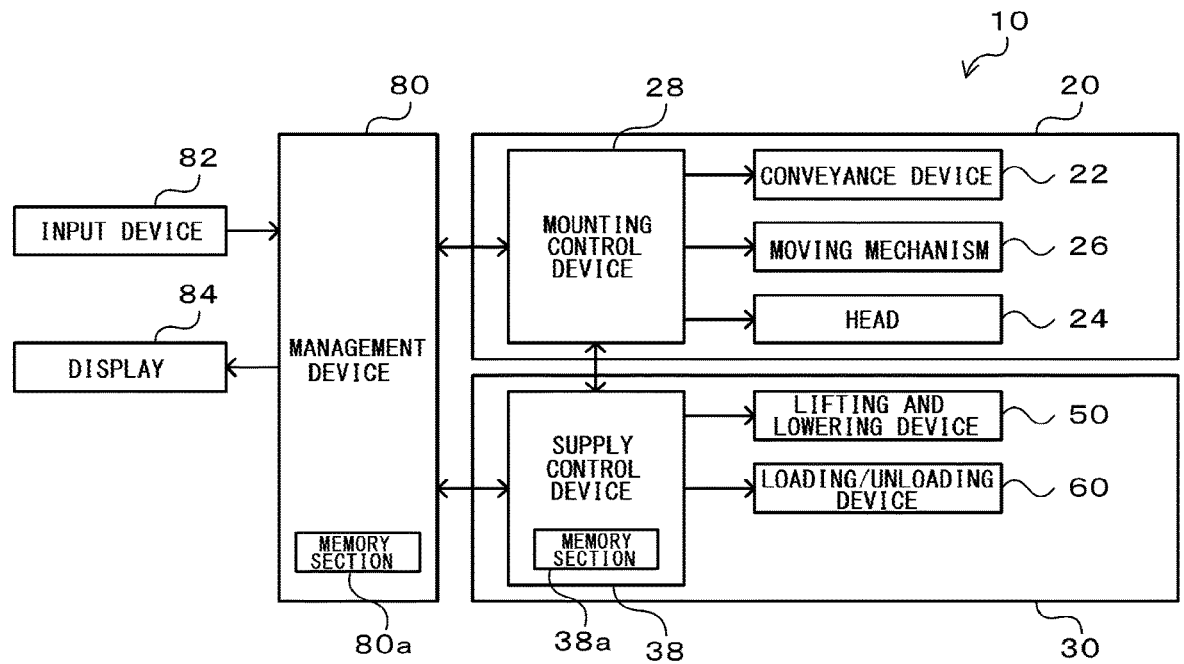
FIG. 4 A diagram related to the control of component mounting system 10.

Next, an embodiment of the present disclosure will be described with reference to the drawings. FIG. 1 is a diagram (perspective view) showing a schematic configuration of component mounting system 10. FIG. 2 is a diagram (side view) showing a schematic configuration of component mounting system 10. FIG. 3 is a diagram (front view) showing a schematic configuration of magazine 40. FIG. 4 is a diagram related to the control of component mounting system 10. In the present embodiment, the left-right direction (X-axis), the front-rear direction (Y-axis), and the vertical direction (Z-axis) are as shown in FIG. 1.

As shown in FIG. 1, component mounting system 10 has component mounting device 20 for mounting components on board S, component supply device 30 for supplying mounting target components to component mounting device 20, and management device 80 for managing the entire system.

As shown in FIG. 1, component mounting device 20 has conveyance device 22 for conveying board S in the X-direction, head 24 to which suction nozzle 23 that picks up components is attached in an up-down movable manner, moving mechanism 26 that moves head 24 in the X and Y directions, and mounting control device 28 (refer to FIG. 4) for controlling the entire device. Mounting control device 28 is constituted by a well-known CPU, ROM, RAM, or the like, and outputs drive signals to conveyance device 22, head 24 (suction nozzle 23), and moving mechanism 26.

As shown in FIG. 2, component supply device 30 has main body 32 provided with doors 34a, 34b at the upper and lower stages in the front, and two magazines 40 are set inside main body 32. Component supply device 30 has lifting and lowering device 50 for independently lifting and lowering each magazine 40, loading/unloading device 60 for unloading pallet P from magazine 40 and loading pallet P into magazine 40, and supply control device 38 (refer to FIG. 4) for controlling the entire device. Of two magazines 40 set in main body 32, upper first magazine 40A, which is set from upper door 34a, mainly accommodates pallets P to be dispensed to the component supply area, and lower second magazine 40B, which is set from lower door 34b, mainly accommodates new pallets P to be delivered to first magazine 40A and used pallets P received from first magazine 40A.

Both first magazine 40A and second magazine 40B have the same size and are similarly configured, and as shown in FIG. 3, have rectangular parallelepiped-shaped housing 42 opened at the front and rear, and multiple support rails 44 provided on left and right inner wall surfaces of housing 42 extending in the front-rear direction and supporting pallet P. Multiple support rails 44 divide the space inside housing 42 into multiple slots (see dotted line in FIG. 3). Since multiple support rails 44 are provided at a constant pitch, each slot also has a constant pitch. Each of first magazine 40A and second magazine 40B of the present embodiment has twelve slots.

Pallet P is a plate made of metal and, as shown in FIG. 3, small tray T is attached to the upper face of pallet P. Tray T is a member made of a resin and attached as an accommodating section for individually accommodating multiple components. The components accommodated in tray T are picked up from above by suction nozzle 23 of component mounting device 20 while pallet P is in the component supply area. The height of tray T depends on the height of the components to be accommodated, and low tray T is used for low components and high tray T is used for high components. The multiple slots in first magazine 40A and second magazine 40B have a pitch corresponding to pallet P on which the lowest tray T is placed. Therefore, if pallet P on which high tray T is placed is accommodated in first magazine 40A or second magazine 40B, one pallet P vertically occupies multiple adjacent slots. In this manner, the number of slots occupied by pallet P to be accommodated, that is, the number of slots necessary for accommodating pallet P is referred to as the number of occupied slots. Although not shown in the figures, pallet P has an identification code indicating individual identification information attached to the front side, and pallet P is managed using the identification number. Pallet P is exemplified by one tray T mounted thereon, but multiple trays T may be mounted side by side.

As shown in FIG. 2, lifting and lowering device 50 has a pair of right and left ball screws 52a extending in the Z-direction, upper holding table 54a attached to ball screw 52a, and drive motor 56a for rotating the ball screw 52a.

Lifting and lowering device 50 moves upper holding table 54a in the Z-direction by rotating the pair of right and left ball screws 52a synchronously by driving drive motor 56a and lifts and lowers the upper first magazine 40A set on holding table 54a. Lifting and lowering device 50 has a ball screw 52b arranged in parallel with ball screw 52a, lower holding table 54b attached to ball screw 52b, and drive motor 56b for rotating ball screw 52b. Lifting and lowering device 50 moves lower holding table 54b in the Z-direction independently of upper holding table 54a by rotating the pair of right and left ball screws 52b synchronously by being driven by driving motor 56b, causing lower second magazine 40B set in holding table 54 to be lifted and lowered.

As shown in FIG. 2, loading/unloading device 60 includes a pair of right and left belt conveyors 66 bridged between driving roller 62 and multiple driven rollers 64, and pallet drawer 68 coupled with belt conveyor 66. The pallet P is provided with a T-shaped handle Ph for pulling out, and a T-shaped notch (not shown) that can be connected to handle Ph is on the front of pallet drawer 68. When holding table 54a on which first magazine 40A is mounted or holding table 54b on which second magazine 40B is mounted is lifted and lowered and pallet P is at a predetermined height, handle Ph of pallet P can be inserted into the notch of pallet drawer 68 positioned at the front of belt conveyor 66, allowing loading/unloading device 60 to connect pallet P to pallet drawer 68. Loading/unloading device 60 can pull out pallet P from first magazine 40A or second magazine 40B and unloading pallet P by driving belt conveyor 66 while pallet P and pallet drawer 68 are connected to each other. As described above, in the present embodiment, pallet P unloaded from first magazine 40A is mainly moved to the component supply area. Further, loading/unloading device 60 can accommodate pallet P in first magazine 40A or second magazine 40B by driving belt conveyor 66 in a direction opposite to that when unloading pallet P. Loading/unloading device 60 moves pallet P from first magazine 40A to second magazine 40B or moves pallet P from second magazine 40B to first magazine 40A by performing the unloading operation or the loading operation.

Figure 5:
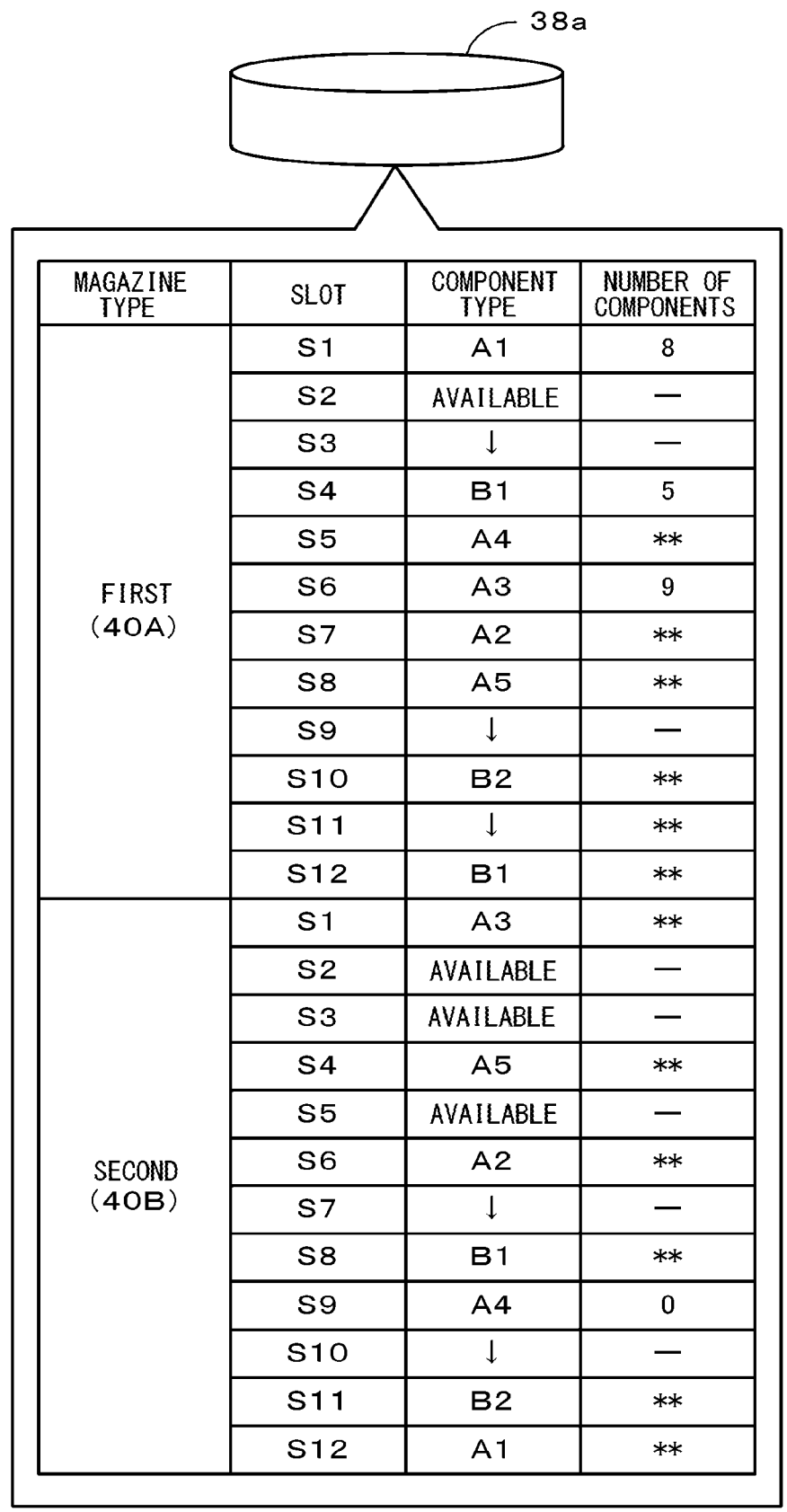

Supply control device 38 is composed of a well-known CPU, ROM, RAM, and the like, and outputs drive signals to lifting and lowering device 50 and loading/unloading device 60. Supply control device 38 stores accommodation information shown in FIG. 5 in memory section 38a consisting of RAM and the like. As shown in the figure, the accommodation information includes component information such as the component type and the number of components in each slot of first magazine 40A and second magazine 40B. Slots S1 to S12 are sequentially numbered from the top of the twelve slots in first magazine 40A and second magazine 40B. When pallet P is accommodated in each of slots S1 to S12, the component type accommodated in tray T on pallet P and the number of remaining components are stored. When pallet P is not accommodated in each of slots S1 to S12, "available" indicating that pallet P is an available slot is stored in the component type column. Further, for pallet P which occupies and accommodates multiple slots, the component type and the number of components are stored in association with the lowest slot among the occupied slots. As an example in which multiple slots are occupied, slots S3 and S4 of first magazine 40A accommodate pallet P (tray T) on which component type B1, with the number of occupied slots being a value of 2, is mounted. As described above, the accommodation information includes information on whether the pallet P is accommodated in each of slots S1 to S12 of magazine 40 and information on the number of occupied slots, the component type, and the number of components when pallet P is accommodated. The operator can move pallet P into and out of second magazine 40B from door 34b even when component supply device 30 is supplying parts from first magazine 40A. When the operator moves pallet P into and out of second magazine 40B, an identification code attached to pallet P is read by a code reader (not shown) and associated with the slot. Supply control device 38 receives the reading result from the code reader and updates the accommodation information about second magazine 40B based on the reading result.

Figure 6:
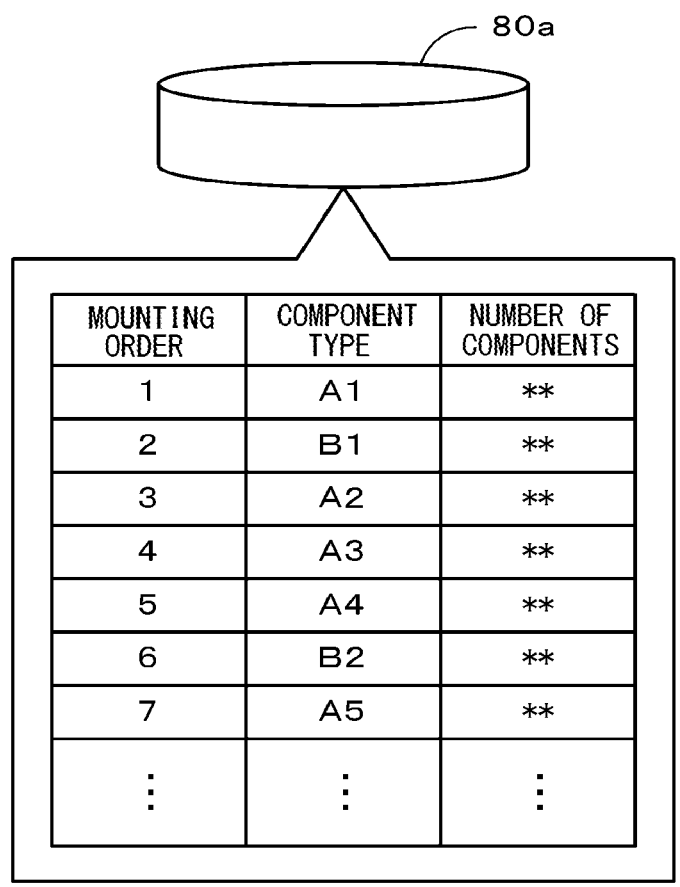

Management device 80 includes a well-known CPU, ROM, RAM, HDD, and the like, and includes input devices 82, such as a keyboard and a mouse, and display 84, which is an LCD or the like. Management device 80 is communicatively connected to mounting control device 28 and supply control device 38. Mounting control device 28 and supply control device 38 are also connected in a communicable manner. Management device 80 stores the production program of board S, the component types accommodated in tray T of each pallet P, information on the height of tray T of each pallet P, and the like. The production program of board S is a program that determines which components are mounted on which board S and how many boards S mounted in such a manner will be manufactured. Management device 80 stores mounting order information shown in FIG. 6 in memory section 80a, which consists of RAM, HDD, or the like. As shown in the figure, the mounting order information stores the mounting order, the component type, and the number of components in association with each other. Component supply device 30 receives a component supply instructions based on mounting order information from management device 80 and supplies components to component mounting device 20.

Figure 7:
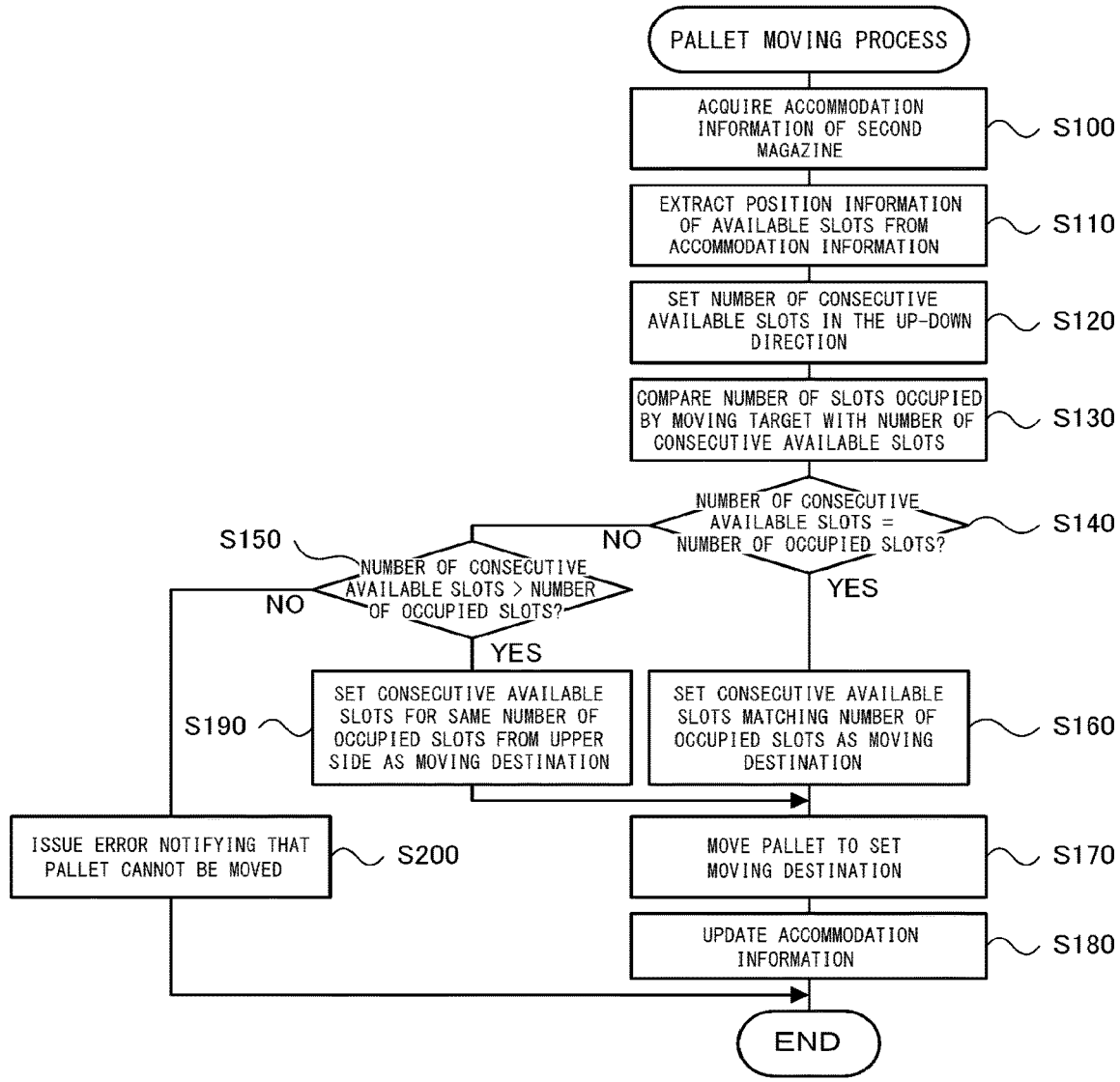
FIG. 7 A flow chart showing an example of a pallet moving process.

The following is a description of the operation of component mounting system 10 configured in this manner, specifically, the operation in component supply device 30 of moving pallet P from first magazine 40A to second magazine 40B. FIG. 7 is a flow chart showing an example of a pallet moving process. This flow chart is executed by supply control device 38. In component supply device 30, for example, a used pallet P in which tray T has become empty of components is moved to second magazine 40B, or pallet P mounted with a component that is not used, due to switching of board S, the component type, or the like, is moved to second magazine 40B. FIG. 8 is a diagram showing a moving destination of pallet P.

In the pallet moving process, supply control device 38 first acquires accommodation information, for second magazine 40B for moving pallet P, from memory section 38a (S100), and extracts position information of available slots in which pallets P are not accommodated from the acquired accommodation information (S110). In the example of FIG. 8, supply control device 38 extracts slots S2, S3, S5 as available slots of second magazine 40B. Subsequently, supply control device 38 sets the number of consecutive slots in which available slots are consecutive in the up-down direction (S120). In the example of FIG. 8, supply control device 38 sets a value of 2 to the consecutive number at the positions of available slots S2, S3, and sets a value of 1 to the consecutive number at the position of available slot S5.

Next, supply control device 38 compares the number of occupied slots by pallet P to be moved, which is the moving target, with the number of consecutive available slots (S130) and first determines whether there is a position where the number of consecutive available slots matches the number of occupied slots (S140), and then determines whether there is a position where the number of consecutive available slots exceeds the number of occupied slots (S150). When it is determined that there is a position where the number of consecutive available slots matches the number of occupied slots in S140, supply control device 38 sets the available slots where the number of consecutive available slots matches the number of occupied slots as the moving destination (S160). Supply control device 38 then controls lifting and lowering device 50 and loading/unloading device 60 so that pallet P is moved to the set moving destination (S170), updates the accommodation information (S180), and ends the pallet moving process. In S180, supply control device 38 deletes the information of pallet P, which is to be moved, from the accommodation information for first magazine 40A and updates the accommodation information by adding information for moving target pallet P to the moving destination (slot) set in S160 in the accommodation information for second magazine 40B.

Here, when moving pallet P of component type A1 to second magazine 40B in the example of FIG. 8, since the number of occupied slots is a value of 1, supply control device 38 determines that the consecutive number of slot S5 having a value of 1 matches the number of occupied slots, instead of a value of 2 of the consecutive slots S2, S3, and sets slot S5 as the moving destination. In this manner, when there are the same number of available slots as the number of occupied slots, supply control device 38 moves pallet P to the available slots. Therefore, when there are the same number of available slots as the number of occupied slots and consecutive available slots exceed the number of occupied slots, supply control device 38 does not move pallet P to the position of the consecutive available slots exceeding the number of occupied slots. Accordingly, in the example of FIG. 8, supply control device 38 can prevent pallet P of component type A1 from moving to either slot S2 or S3 of second magazine 40B by, for example, setting a moving destination in order from the upper side of the available slots. For this reason, dispersion of available slots, by accommodating pallet P in available slot clusters, can be minimized. As a result, supply control device 38 can minimize the occurrence of a situation in which pallet P cannot be moved due to having the number of occupied slots with a value of 2, for example, when attempting to move pallet P of component type B1 to the second magazine (the movement indicated by the dotted line in FIG. 8).

Further, when it is determined that there is no position where the number of consecutive available slots in S140 matches the number of occupied slots, and when it is determined that there is a position where the number of consecutive available slots exceeds the number of occupied slots in subsequent step S150, supply control device 38 sets the available slots for the number of occupied slots from the upper side of said position as the moving destination (S190). Supply control device 38 then moves pallet P to the set moving destination (S170), updates the accommodation information (S180), and ends the pallet moving process. In the example of FIG. 8, when pallet P of component type A1 is moved to slot S5 of second magazine 40B and then pallet P having the number of occupied slots with a value of 1 is moved again, supply control device 38 sets slot S1 on the upper side of slots S2, S3 as the moving destination and moves pallet P. Of course, supply control device 38 may set the lower slot S3 of slots S2, S3 as the moving destination.

On the other hand, when it is determined that there is no position where the number of consecutive available slots in S150 does not exceed the number of occupied slots, supply control device 38 issues a pallet moving error (S200)

because there are no slots that can accommodate pallet P to be moved, which is the moving target, in second magazine 40B, and ends the pallet moving process. When component supply device 30 has an error indicator lamp (not shown), supply control device 38 sends out a notification about the error by turning on the error indicator lamp. Alternatively, supply control device 38 may output error information to management device 80 to cause display 84 of management device 80 to issue an error notification. As described above, in the present embodiment, it is possible to minimize the occurrence of a situation in which pallet P cannot be moved to second magazine 40B, and therefore, it is possible to prevent supply control device 38 from frequently performing the S200 error notification process.

Here, the correspondence between the constituent elements of the present embodiment and the constituent elements of the component supply device of the present disclosure will be described. First magazine 40A of the present embodiment corresponds to the first magazine of the present disclosure, second magazine 40B corresponds to the second magazine, loading/unloading device 60 corresponds to the loading/unloading device, memory section 38a corresponds to the storage device, and supply control device 38 corresponds to the control device. In the present embodiment, an example of a method for moving a pallet of the present disclosure will also be described by describing the operation of component supply device 30.

When pallet P is moved from first magazine 40A to second magazine 40B, component supply device 30 of the embodiment described above sets the moving destination, based on the number of occupied slots by pallet P, which is to be moved, among the available slots based on the accommodation information about second magazine 40B, and moves pallet P. Therefore, pallet P can be moved to a slot position corresponding to the number of occupied slots by pallet P.

Further, when there is a position where the number of consecutive available slots, in which the available slots are consecutive in the up-down direction in second magazine 40B, matches the number of occupied slots by pallet P and there is a position where the number of consecutive available slots exceeds the number of occupied slots by pallet P, component supply device 30 sets the position where the number of consecutive available slots matches the number of occupied slots as the moving destination. Therefore, since pallet P can be appropriately accommodated at a position corresponding to the required number of occupied slots, the movement of pallet P can be smoothly performed while minimizing the dispersion of available slots. Therefore, it is possible to minimize the occurrence of a situation in which pallet P cannot be moved because there are no empty slots corresponding to the number of occupied slots.

The present disclosure is not limited in any way to the above-mentioned embodiments, and it is needless to say that the present disclosure can be implemented in various forms as long as they fall within the technical scope of the present disclosure.

Figure 9:
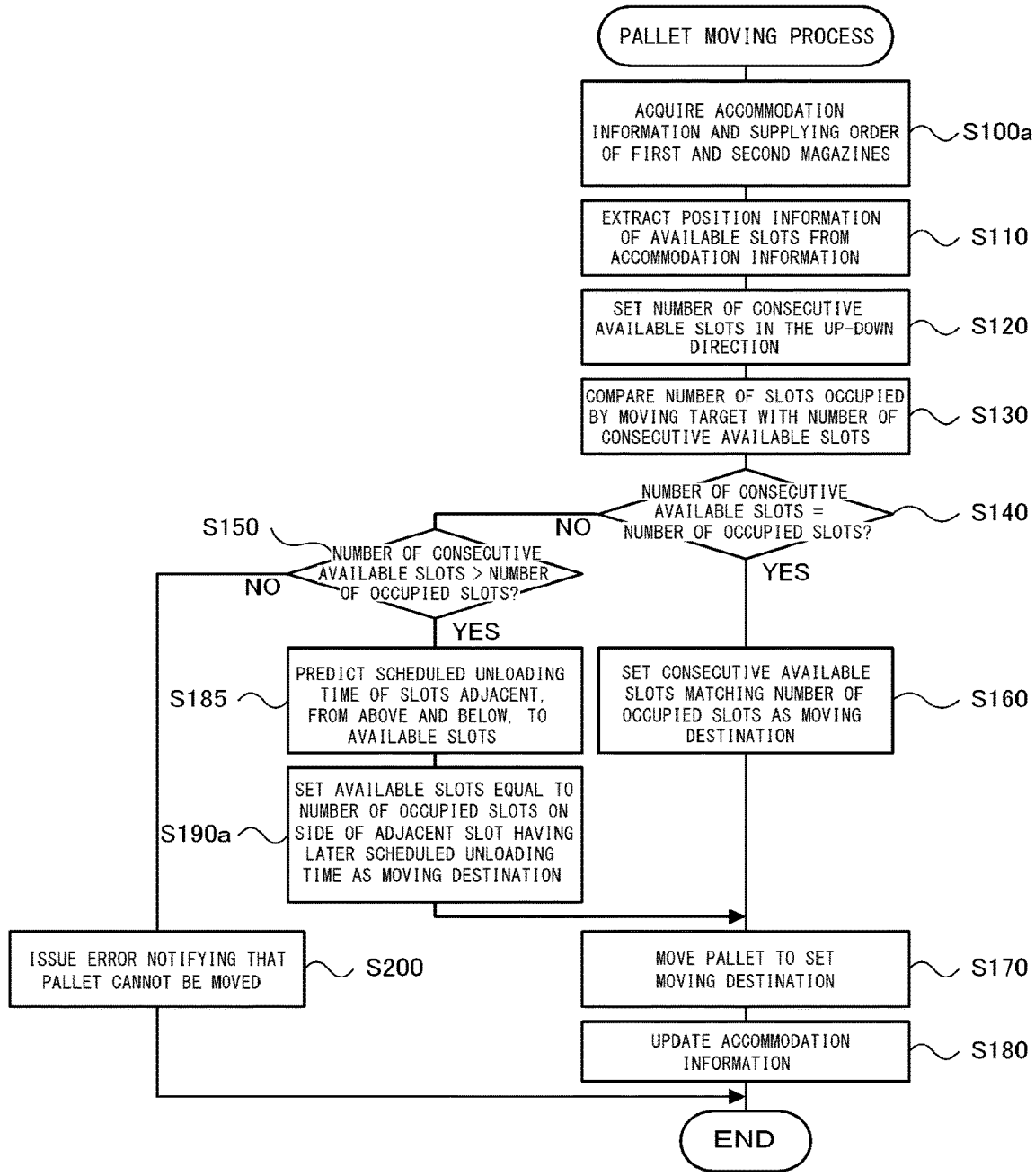
FIG. 9 A flow chart showing a pallet moving process of a modification.

For example, in the embodiment described above, in the case where pallet P is moved from first magazine 40A to second magazine 40B, the moving destination is set based on the number of occupied slots by pallet P to be moved, which is the moving target, among the current available slots based on the accommodation information about second magazine 40B, but the present disclosure is not limited thereto. For example, the moving destination of pallet P may be set based on the number of occupied slots by pallet P to be moved, which is the moving target, among the currently available slots and the available state of the slots hereafter. FIG. 9 is a flow chart showing a pallet moving process of a modification, and FIG. 10 is a diagram showing the moving destination of pallet P of the modification. In the flow chart of FIG. 9, the same processes as those of the flow chart of FIG. 7 are denoted by the same step numbers, and detailed descriptions thereof are omitted.

In the pallet moving process of this modification, supply control device 38 acquires the accommodation information of first magazine 40A and second magazine 40B and the supplying order of components (S100a), and executes S110 and subsequent processes. As described above, since the mounting order information of the components is stored in memory section 80a of management device 80, supply control device 38 can acquire the mounting order of the components, that is, the supplying order of the components, by communicating with management device 80 in S100a. The supplying order of the components includes the number of mountings (supplying number) for each component type.

When it is then determined that the number of consecutive available slots in S150 exceeds the number of occupied slots by pallet P to be moved, which is the moving target, supply control device 38 predicts the scheduled unloading time when pallets P accommodated in slots adjacent to available slots, from above and below, will be unloaded (S185). In the example of FIG. 10, as shown in FIG. 10A, the scheduled unloading times are predicted for slots S1, S4, which are adjacent to available slots S2, S3 from above and below, respectively. In this instance, supply control device 38 predicts the scheduled unloading time for component types A3, A5 in adjacent slots S1, S4 based on the number of remaining components in first magazine 40A, the supplying order acquired in S100a, and the number of mounted components (supplying number) of component types A3, A5 included in the supplying order. First, supply control device 38 confirms whether pallets P of component types A3, A5 are accommodated from the accommodation information of first magazine 40A and extracts the number of remaining components of each of component types A3, A5 when pallet P is accommodated. Next, supply control device 38 determines whether pallet P needs to be conveyed out from second magazine 40B to first magazine 40A and the components need to be replenished so that the number of components to be mounted (the number of supplied components) of component types A3, A5 included in the supplying order acquired in S100a exceeds the number of remaining components in first magazine 40A. Since the latest time at which such components are supplied while supplying components of said component type, the component type in which the mounting order of the component is earlier is performed earlier and the scheduled time for conveying out pallet P is also earlier. In this manner, supply control device 38 predicts the scheduled unloading of adjacent slots S1, S4. In the example of FIG. 10, supply control device 38 predicts that slot S1 in which pallet P of component type A3 is accommodated is unloaded earlier than slot S4 in which pallet P of component type A5 is accommodated based on the number of remaining components of FIG. 5, the mounting order of FIG. 6, and the like.

Then, supply control device 38 sets a portion equal to the number of occupied slots as the moving destination starting from the slot, among the adjacent slots, whose unloading is scheduled later (S190a). In the example of FIG. 10, supply control device 38 sets slot S3 that is one slot from the adjacent slot S4 side as the moving destination, and moves pallet P of component type A1 (FIG. 10B). In this manner, supply control device 38 sets the moving destination starting from side, among the adjacent slots, whose unloading is scheduled latest, and causes an available slot to remain on the side whose unloading is scheduled earlier. Therefore, when the scheduled unloading time comes while the components are being supplied, and pallet P of component type A3 moves to first magazine 40A and slot S1 becomes available, slots S1, S2 become consecutive available slots, as shown in FIG. 10C. If pallet P of component type A1 is moved to available slot S2, slots S1, S3 become available slots, thereby dispersing the available slots. In this case, supply control device 38 cannot move pallet P having the number of occupied slots with a value of 2. Therefore, in this modification, supply control device 38 predicts the future availability of slots adjacent to the available slots, thereby preventing available slots from being dispersed and instead forming clusters of available slots. Accordingly, for example, when use of pallet P having the number of occupied slots with a value of 2 is completed, it is possible to prevent the occurrence of a situation in which pallet P cannot be moved to second magazine 40B because there are no available slots corresponding to the number of occupied slots. Of course, since the two slots are consecutive available slots, it is possible to suitably accept pallet P having the number of occupied slots with a value of 1 when pallet P has been used.

In this modification, consecutive available slots which were consecutive at one location were focused on and the scheduled unloading of two slots adjacent to the location from above and below were compared, but the present disclosure is not limited to this. When there are multiple consecutive available slots in which the number of consecutive available slots is the same, the scheduled unloading times of multiple adjacent slots adjacent to each of the multiple consecutive available slots from above and below may be compared. For example, when there are slots S7, S8 other than slots S2, S3 as consecutive available slots, the scheduled unloading times of the two adjacent slots S1, S4 adjacent to slots S2, S3 and the two adjacent slots S6, S9 adjacent to slots S7, S8 may be compared. In this manner, it is sufficient to compare the scheduled unloading times of each pallet among the four adjacent slots adjacent to the two locations of consecutive available slots from above and below, and set the moving destination from the adjacent slot side having the latest scheduled unloading time. Further, the present disclosure is not limited to consecutive available slots, and when there multiple available slots consisting of one slot, the scheduled unloading time of the adjacent slots adjacent to each available slot may be compared and the moving destination may be set to the available slot adjacent to the adjacent slot having the later scheduled unloading time.

In this modification, supply control device 38 acquires the mounting order information by communication with management device 80 and acquires the supplying order, but the present disclosure is not limited to this, and it will suffice if supply control device 38 acquires the information by communication with component mounting device 20 or the like. The supply control device 38 may store the supplying order of components in memory section 38a in advance, or may acquire the supplying order from memory section 38a in S100a.

In the above-described embodiment, lifting and lowering device 50 lifts and lowers magazine 40, but the present disclosure is not limited to this, and any device may be used as long as magazine 40 is lifted and lowered relative to loading/unloading device 60. For example, the height of magazine 40 may be fixed, and loading/unloading device 60 may be lifted and lowered.

In the embodiment described above, component supply device 30 uses two magazines, that is, first magazine 40A and second magazine 40B, but three or more magazines may be used since the requirement is that at least two magazines are used. Further, the movement of pallet P is not limited to the movement from first magazine 40A to second magazine 40B, as long as the movement is of pallet P from one of multiple magazines 40 to another magazine, for example, the movement may be of pallet P from second magazine 40B to first magazine 40A or the like.

In the embodiment described above, one slot or two slots are exemplified as the number of occupied slots by pallet P, but the present disclosure is not limited to this, and multiple slots of three or more occupied slots may be used.

In the embodiment described above, loading/unloading device 60 pulls out pallet P from magazine 40 to the component supply area and transfers pallet P to and from first magazine 40A and second magazine 40B, but the present disclosure is not limited thereto. For example, loading/unloading device 60 may pull out pallet P from magazine 40 to the component supply area and a device different from the loading/unloading device may transfer pallet P to and from first magazine 40A and second magazine 40B. Further, the accommodation positions of pallets P accommodated in first magazine 40A and second magazine 40B may be changed while the components are being supplied from one pallet P to component mounting device 20. In such a case, for example, the accommodation position of each pallet P may be changed so that the available slots are contiguous.

The component supply device of the present disclosure may be configured as follows.

In the component supply device of the present disclosure, with the consecutive available slots being available in the second magazine with being arranged consecutively in the up-down direction, and when there are places in which the number of the consecutive available slots matches the number of slots occupied by the pallet to be moved, and in which the number of the consecutive available slots exceeds the number of slots occupied by the pallet to be moved, the control device may set the place where the number of consecutive available slots matches the number of occupied slots as a moving destination. By doing so, since it is possible to efficiently accommodate pallets by minimizing the dispersion of available slots in the magazine, it is therefore possible to minimize the occurrence of a situation in which pallet cannot be moved because there are no available slots corresponding to the number of occupied slots.

In the component supply device of the present disclosure, the storage device may store the accommodation information including the component type, and the control device may acquire supply information including the supplying order for each component type, may identify adjacent slots accommodating the pallet having a later scheduled unloading time based on the supply information, the adjacent slots being adjacent to the available slots of the second magazine in the up-down direction, and the control device may set the available slots on the side of the identified adjacent slot as a moving destination. By doing so, a cluster of available slots can be formed when a pallet is conveyed out in conjunction with the supplying of components. Therefore, it is possible to minimize the occurrence of a situation in which pallet P cannot be moved because there are no available slots corresponding to the number of occupied slots.

The method for moving a pallet of the present disclosure is a method for moving a pallet, being provided with an accommodating section configured to accommodate components to be picked up, from a first magazine to a second magazine among multiple magazines, each being provided with multiple slots capable of accommodating the respective pallets by allotting one or more of the slots depending on the height of the accommodating section, the method for moving a pallet comprising steps of: (a) acquiring accommodation information of the pallets accommodated in the second magazine; and (b) setting a moving destination in accordance with the number of slots occupied by the pallet, which is to be moved, from among available slots based on the accommodation information about of the second magazine acquired in step (a), and moving the pallet to the set moving destination.

Similarly to the component supply device described above, the method for moving a pallet of the present disclosure can smoothly transfer the pallet between the magazines while minimizing the dispersion of available slots since the pallet can be appropriately moved to the moving destination corresponding to the number of slots necessary to accommodate the pallet. In this method for moving a pallet, various modes of the above-described component supply device may be adopted, or a configuration for achieving each function of the above-described component supply device may be added.

INDUSTRIAL APPLICABILITY

The present disclosure can be applied to a device that uses a tray to supply components.

REFERENCE SIGNS LIST

10 Component mounting system, 20 Component mounting device, 22 Conveyance device, 23 Suction nozzle, 24 Head, 26 Moving mechanism, 28 Mounting control device, 30 Component supply device, 32 Main body, 34a, 34b Door, 38 Supply control device, 38a Memory section, 40 Magazine, 40A First magazine, 40B Second magazine, 42 Housing, 44 Support rail, 50 Lifting and lowering device, 52a, 52b Ball screw, 54a, 54b Holding table, 56a, 56b Drive motor, 60 Loading/unloading device, 62 Driving roller, 64 Driven roller, 66 Belt conveyor, 68 Pallet pulling-out section, 80 Management device, 80a Memory section, 82 Input device, 84 Display, S Board, P Pallet, Ph Handle, T Tray.

The invention claimed is:

1. A component supply device configured to supply components by using pallets, each of which is provided with an accommodating section configured to accommodate the components to be picked up, the component supply device comprising:
multiple magazines each being provided with multiple support rails at a constant pitch dividing an inside space of the magazine into multiple slots, each slot having a constant pitch, the multiple slots being capable of accommodating the respective pallets by allotting one or more of the slots depending on a height of the accommodating section, the multiple magazines including a first magazine capable of accommodating the pallets to be dispensed to a supply area of the components, and a second magazine capable of accommodating the pallets to be transferred to and from the first magazine;
a lifting and lowering device configured to move the multiple magazines up and down relative to a loading/unloading device configured to convey the pallets into and out of the slots;
a storage device configured to store accommodation information of the pallets accommodated in the multiple magazines; and
a control device,
wherein, in a case of moving the pallet from the first magazine to the second magazine among the multiple magazines, the control device is configured to
acquire information of available slots of the second magazine based on the accommodation information about the second magazine,
set a number of consecutive slots in which the available slots of the second magazine are consecutive in an up-down direction at each position of the available slots,
compare a number of slots occupied by the pallet to be moved with the number of consecutive slots at each position of the available slots,
determine whether there is a position in which the number of consecutive slots is equal to the number of slots occupied by the pallet,
when there is a determined position in which the number of consecutive slots is equal to the number of slots occupied by the pallet, set a moving destination to the determined position,
when there is not a determined position in which the number of consecutive slots is equal to the number of slots occupied by the pallet, determine whether there is a position in which the number of consecutive slots is greater than the number of slots occupied by the pallet,
when there is a determined position in which the number of consecutive slots is greater than the number of slots occupied by the pallet, set a moving destination to the determined position, set one of the slots on the determined position as the moving destination, and
control the lifting and lowering device and the loading/unloading device so as to move the pallet to the moving destination.

2. The component supply device of claim 1,
wherein the storage device stores the accommodation information including the component type, and
wherein the control device acquires supply information including the supplying order for each component type, identifies adjacent slots accommodating the pallet having a later scheduled unloading time based on the supply information, the adjacent slots being adjacent to the available slots of the second magazine in the up-down direction, and the control device sets the available slots on the side of the identified adjacent slot as the moving destination when there is a determined position in which the number of consecutive slots is greater than the number of slots occupied by the pallet.

3. The component supply device of claim 1,
wherein the control device is configured to issue an error when there is not a determined position in which the number of consecutive slots is equal to the number of slots occupied by the pallet, and there is not a determined position in which the number of consecutive slots is greater than the number of slots occupied by the pallet.

4. A method for moving a pallet, being provided with an accommodating section configured to accommodate components to be picked up, from a first magazine to a second magazine among multiple magazines, each being provided with multiple support rails at a constant pitch dividing an inside space of the magazine into multiple slots, each slot having a constant pitch, the multiple slots being capable of accommodating the respective pallets by allotting one or more of the slots depending on a height of the accommodating section, the method for moving a pallet comprising:

acquiring accommodation information of the pallets accommodated in the second magazine, the accommodation information including information of available slots of the second magazine;

setting a number of consecutive slots in which the available slots of the second magazine are consecutive in an u-down direction at each position of the available slots;

comparing a number of slots occupied by the pallet to be moved with the number of consecutive slots at each position of the available slots;

determining whether there is a position in which the number of consecutive slots is equal to the number of slots occupied by the pallet, when there is a determined position in which the number of consecutive slots is equal to the number of slots occupied by the pallet, setting a moving destination to the determined position;

when there is not a determined position in which the number of consecutive slots is equal to the number of slots occupied by the pallet, determining whether there is a position in which the number of consecutive slots is greater than the number of slots occupied by the pallet, when there is a determined position in which the number of consecutive slots is greater than the number of slots occupied by the pallet, setting a moving destination to the determined position, setting one of the slots on the determined position as the moving destination; and moving the pallet to the set moving destination.

* * * * *